(12) United States Patent
Maeda et al.

(10) Patent No.: US 11,903,202 B2
(45) Date of Patent: Feb. 13, 2024

(54) METHOD OF MANUFACTURING SEMICONDUCTOR DEVICE

(71) Applicant: Kioxia Corporation, Tokyo (JP)

(72) Inventors: Aki Maeda, Yokkaichi (JP); Noritaka Ishihara, Nagoya (JP); Atsushi Fukumoto, Kuwana (JP); Shuto Yamasaka, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 175 days.

(21) Appl. No.: 17/393,642

(22) Filed: Aug. 4, 2021

(65) Prior Publication Data

US 2022/0302158 A1 Sep. 22, 2022

(30) Foreign Application Priority Data

Mar. 19, 2021 (JP) .................................. 2021-046203

(51) Int. Cl.
*H10B 43/27* (2023.01)
*H01L 21/225* (2006.01)
*H01L 21/02* (2006.01)

(52) U.S. Cl.
CPC ......... *H10B 43/27* (2023.02); *H01L 21/2254* (2013.01); *H01L 21/0217* (2013.01); *H01L 21/0262* (2013.01); *H01L 21/02211* (2013.01); *H01L 21/02271* (2013.01); *H01L 21/02532* (2013.01); *H01L 21/02592* (2013.01)

(58) Field of Classification Search
CPC . H10B 43/27; H01L 21/2254; H01L 21/0217; H01L 21/02211; H01L 21/02271; H01L 21/02532; H01L 21/02592; H01L 21/0262; H01L 29/40117
See application file for complete search history.

(56) References Cited

U.S. PATENT DOCUMENTS

| | | | |
|---|---|---|---|
| 6,337,259 B1 | 1/2002 | Ueda et al. | |
| 7,232,742 B1 | 6/2007 | Maekawa | |
| 7,674,663 B2 | 3/2010 | Yamazaki et al. | |
| 7,795,111 B2 | 9/2010 | Shimomura et al. | |
| 2004/0065250 A1* | 4/2004 | Komiya | C30B 15/00 |
| | | | 117/19 |

(Continued)

FOREIGN PATENT DOCUMENTS

| | | |
|---|---|---|
| JP | 2001-223219 A | 8/2001 |
| JP | 3425392 B2 | 7/2003 |

(Continued)

*Primary Examiner* — Farun Lu
*Assistant Examiner* — Sandra Milena Rodriguez Villanu
(74) *Attorney, Agent, or Firm* — Oblon, McClelland, Maier & Neustadt, L.L.P.

(57) ABSTRACT

In one embodiment, a method of manufacturing a semiconductor device includes forming a semiconductor layer including a plurality of metal atoms on a substrate, and forming a first layer including a plurality of silicon atoms and a plurality of nitrogen atoms on the semiconductor layer. The method further includes transferring at least some of the metal atoms in the semiconductor layer into the first layer, and removing the first layer after transferring the at least some of the metal atoms in the semiconductor layer into the first layer. Furthermore, a ratio of a number of the nitrogen atoms relative to a number of the silicon atoms and the nitrogen atoms in the first layer is smaller than 4/7.

20 Claims, 14 Drawing Sheets

(56) References Cited

U.S. PATENT DOCUMENTS

| | | | | |
|---|---|---|---|---|
| 2004/0224486 | A1* | 11/2004 | Ichijo | H01L 21/02422 |
| | | | | 257/E21.101 |
| 2005/0239267 | A1* | 10/2005 | Tobashi | H01L 21/76259 |
| | | | | 438/455 |
| 2019/0164742 | A1* | 5/2019 | Noguchi | H01L 21/0228 |
| 2019/0371810 | A1* | 12/2019 | Saito | H01L 29/7926 |

FOREIGN PATENT DOCUMENTS

| JP | 2004-128421 A | 4/2004 |
|---|---|---|
| JP | 2009-033123 A | 2/2009 |

\* cited by examiner

METHOD OF MANUFACTURING SEMICONDUCTOR DEVICE

CROSS REFERENCE TO RELATED APPLICATION

This application is based upon and claims the benefit of priority from the prior Japanese Patent Application No. 2021-046203, filed on Mar. 19, 2021, the entire contents of which are incorporated herein by reference.

FIELD

Embodiments described herein relate to a method of manufacturing a semiconductor device.

BACKGROUND

When metal atoms are to be removed from a semiconductor layer into a layer called a getter layer, it is desirable to form a preferable getter layer.

DETAILED DESCRIPTION

Embodiments will now be explained with reference to the accompanying drawings. In FIGS. 1 to 14, the same components are given the same signs and duplicated description of the same components is omitted.

In one embodiment, a method of manufacturing a semiconductor device includes forming a semiconductor layer including a plurality of metal atoms on a substrate, and forming a first layer including a plurality of silicon atoms and a plurality of nitrogen atoms on the semiconductor layer. The method further includes transferring at least some of the metal atoms in the semiconductor layer into the first layer, and removing the first layer after transferring the at least some of the metal atoms in the semiconductor layer into the first layer. Furthermore, a ratio of a number of the nitrogen atoms relative to a number of the silicon atoms and the nitrogen atoms in the first layer is smaller than 4/7.

First Embodiment

Figure 1:
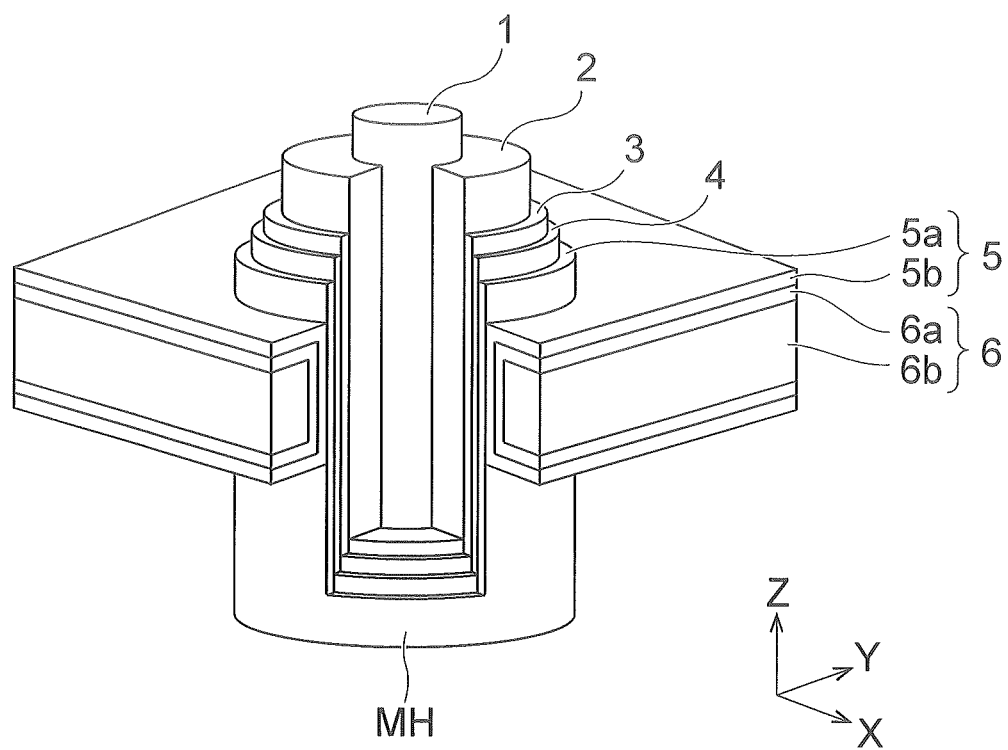
FIG. 1 is a perspective view showing a structure of a semiconductor device of a first embodiment.

FIG. 1 is a perspective view showing a structure of a semiconductor device of a first embodiment. An example of the semiconductor device in FIG. 1 is a three-dimensional semiconductor memory.

The semiconductor device in FIG. 1 includes a core insulator 1, a channel semiconductor layer 2, a tunnel insulator 3, a charge storing layer 4, a block insulator 5 and an electrode layer 6. The block insulator 5 includes an insulator 5a and an insulator 5b. The electrode layer 6 includes a barrier metal layer 6a and an electrode material layer 6b.

In the semiconductor device in FIG. 1, a plurality of electrode layers and a plurality of insulating layers are alternately stacked on a substrate, and a plurality of memory holes are provided in these electrode layers and insulating layers. FIG. 1 shows one electrode layer 6 of these electrode layers and one memory hole MH of these memory holes. These electrode layers function as word lines or selection lines, for example.

FIG. 1 shows an X-direction and a Y-direction which are parallel to a surface of the substrate and perpendicular to each other, and a Z-direction perpendicular to the surface of the substrate. In the present specification, the +Z-direction is regarded as the upward direction and the −Z-direction is regarded as the downward direction. The −Z-direction may coincide with the direction of gravity or does not have to coincide with the direction of gravity. In FIG. 1, the electrode layer 6 spreads in the X-direction and the Y-direction, and the memory hole MH extends in the Z-direction.

The core insulator 1, the channel semiconductor layer 2, the tunnel insulator 3, the charge storing layer 4, and the insulator 5a are formed in the memory hole MH and, along with the aforementioned electrode layer, constitute a memory cell transistor (memory cell) and a selection transistor of the three-dimensional semiconductor memory.

The insulator 5a is formed on surfaces of the electrode layers and the insulating layers in the memory hole MH, and the charge storing layer 4 is formed on a surface of the insulator 5a. The charge storing layer 4 is provided for storing a signal charge in the memory cell transistor. The tunnel insulator 3 is formed on a surface of the charge storing layer 4, and the channel semiconductor layer 2 is formed on a surface of the tunnel insulator 3. The channel semiconductor layer 2 functions as a channel for the memory cell transistor and the selection transistor. The core insulator 1 is formed in the channel semiconductor layer 2.

An example of the insulator 5a is a $SiO_2$ film (silicon oxide film). An example of the charge storing layer 4 is a SiN film (silicon nitride film). An example of the tunnel insulator 3 is a SiON film (silicon oxynitride film). An example of the channel semiconductor layer 2 is a polysilicon layer. An example of the core insulator 1 is a $SiO_2$ film.

The insulator 5b, the barrier metal layer 6a and the electrode material layer 6b are formed between the adjacent insulating layers to each other, and are sequentially formed on the lower face of the upper insulating layer, the upper face of the lower insulating layer, and a lateral face of the insulator 5a. An example of the insulator 5b is a metal insulator such as an $Al_2O_3$ film (aluminum oxide film). An example of the barrier metal layer 6a is a TiN film (titanium nitride film). An example of the electrode material layer 6b is a W (tungsten) layer.

Figure 2:
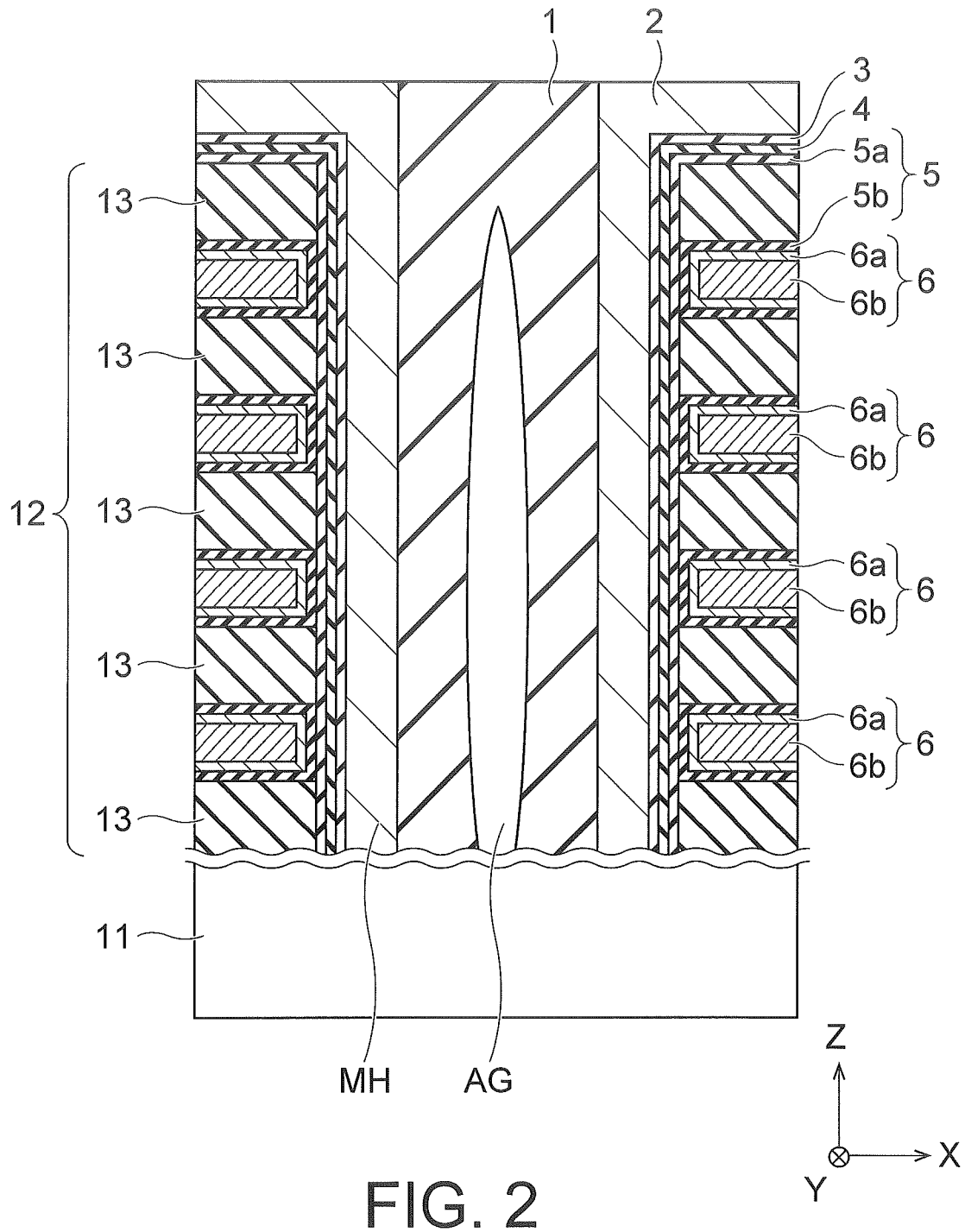
FIG. 2 is a sectional view showing a structure of the semiconductor device of the first embodiment.

FIG. 2 is a sectional view showing a structure of the semiconductor device of the first embodiment. FIG. 2 shows an XZ-cross section of the memory hole MH in FIG. 1.

As shown in FIG. 2, the semiconductor device of the present embodiment includes the core insulator 1, the channel semiconductor layer 2, the tunnel insulator 3, the charge storing layer 4, the block insulator 5, the plurality of electrode layers 6, a substrate 11, a stacked film 12 and a plurality of insulating layers 13. In FIG. 2, the block insulator 5 includes the insulator 5a and a plurality of insulators 5b, and each electrode layer 6 includes the barrier metal layer 6a and the electrode material layer 6b. The semiconductor device of the present embodiment further includes the memory hole MH and an air gap AG.

An example of the substrate 11 is a semiconductor substrate such as a Si (silicon) substrate. Like FIG. 1, FIG. 2 shows the X-direction and the Y-direction parallel to the surface of the substrate 11 and perpendicular to each other, and the Z-direction perpendicular to the surface of the substrate 11.

The stacked film 12 includes the plurality of electrode layers 6 and the plurality of insulating layers 13 alternately stacked on the substrate 11. The stacked film 12 may be directly formed on the substrate 11 or may be formed on the substrate 11 via another layer. An example of each of the insulating layers 13 is a $SiO_2$ film. The barrier metal layer 6a and the electrode material layer 6b in each electrode layer 6 are sequentially formed between the adjacent insulating layers 13 to each other in the Z-direction via the insulator 5b.

The insulator 5a, the charge storing layer 4, the tunnel insulator 3, the channel semiconductor layer 2 and the core insulator 1 are sequentially formed on the lateral face of the stacked film 12 in the memory hole MH. The insulator 5a, the charge storing layer 4, the tunnel insulator 3 and the channel semiconductor layer 2 of the present embodiment are further sequentially formed on the upper face of the stacked film 12 outside the memory hole MH. Moreover, the core insulator 1 of the present embodiment includes the air gap AG which is filled with air.

FIGS. 3 to 8 are sectional views showing a method of manufacturing the semiconductor device of the first embodiment.

Figure 3:
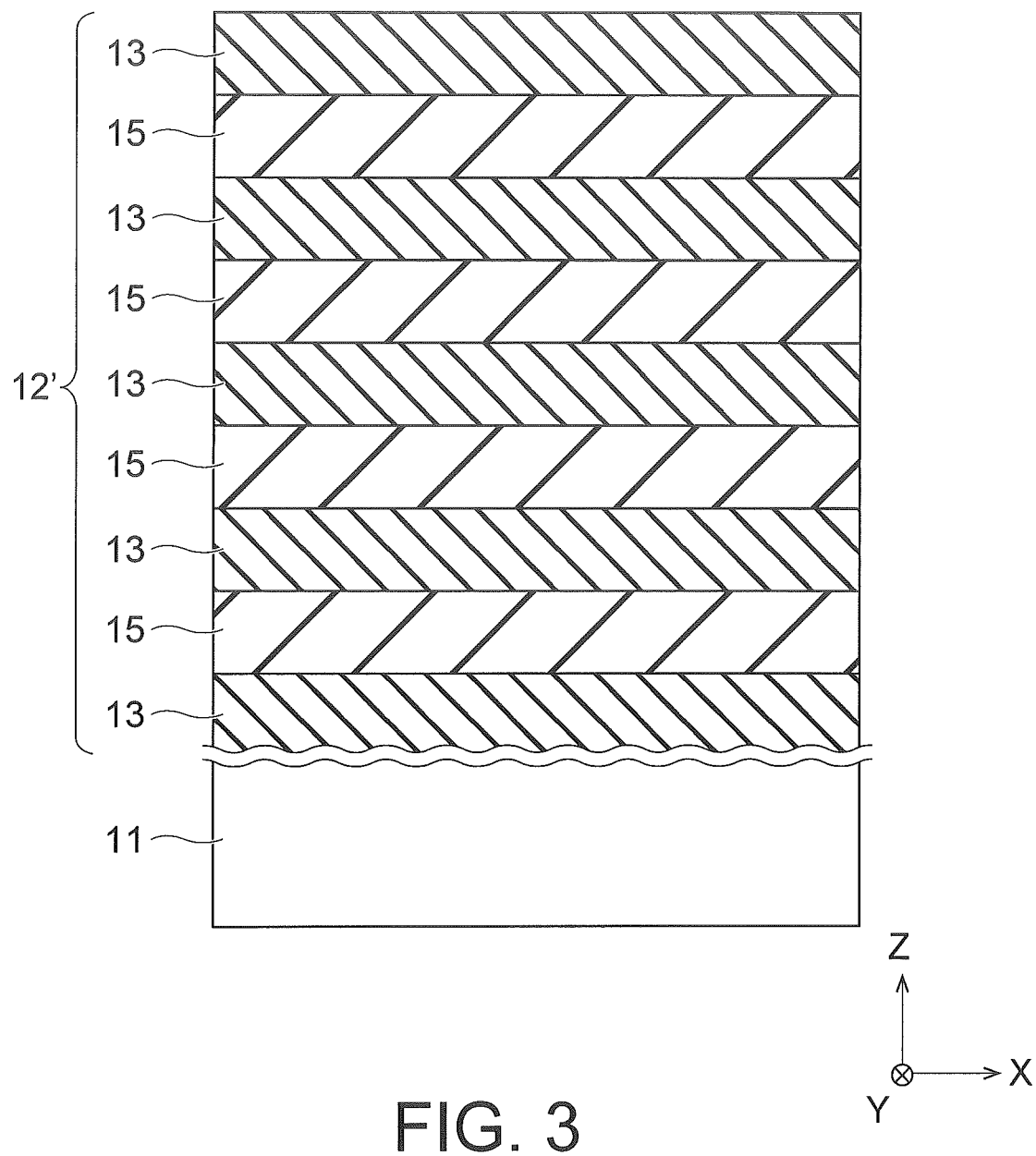
FIGS. 3 to 8 are sectional views showing a method of manufacturing a semiconductor device of the first embodiment.

First, a stacked film 12' is formed on the substrate 11 (FIG. 3). The stacked film 12' is formed by alternately forming the plurality of insulating layers 13 and a plurality of sacrificial layers 15 on the substrate 11. An example of each of the sacrificial layers 15 is a SiN film. The sacrificial layers 15 are formed for replacing them by the electrode layers 6 in a step mentioned later. By forming the electrode layers 6 in place of the sacrificial layers 15 in the step shown in FIG. 3, the step of replacing the sacrificial layers 15 by the electrode layers 6 may be omitted. Each of the insulating layers 13 is an example of a first film, and each of the sacrificial layers 15 and the electrode layers 6 is an example of a second film.

Figure 4:
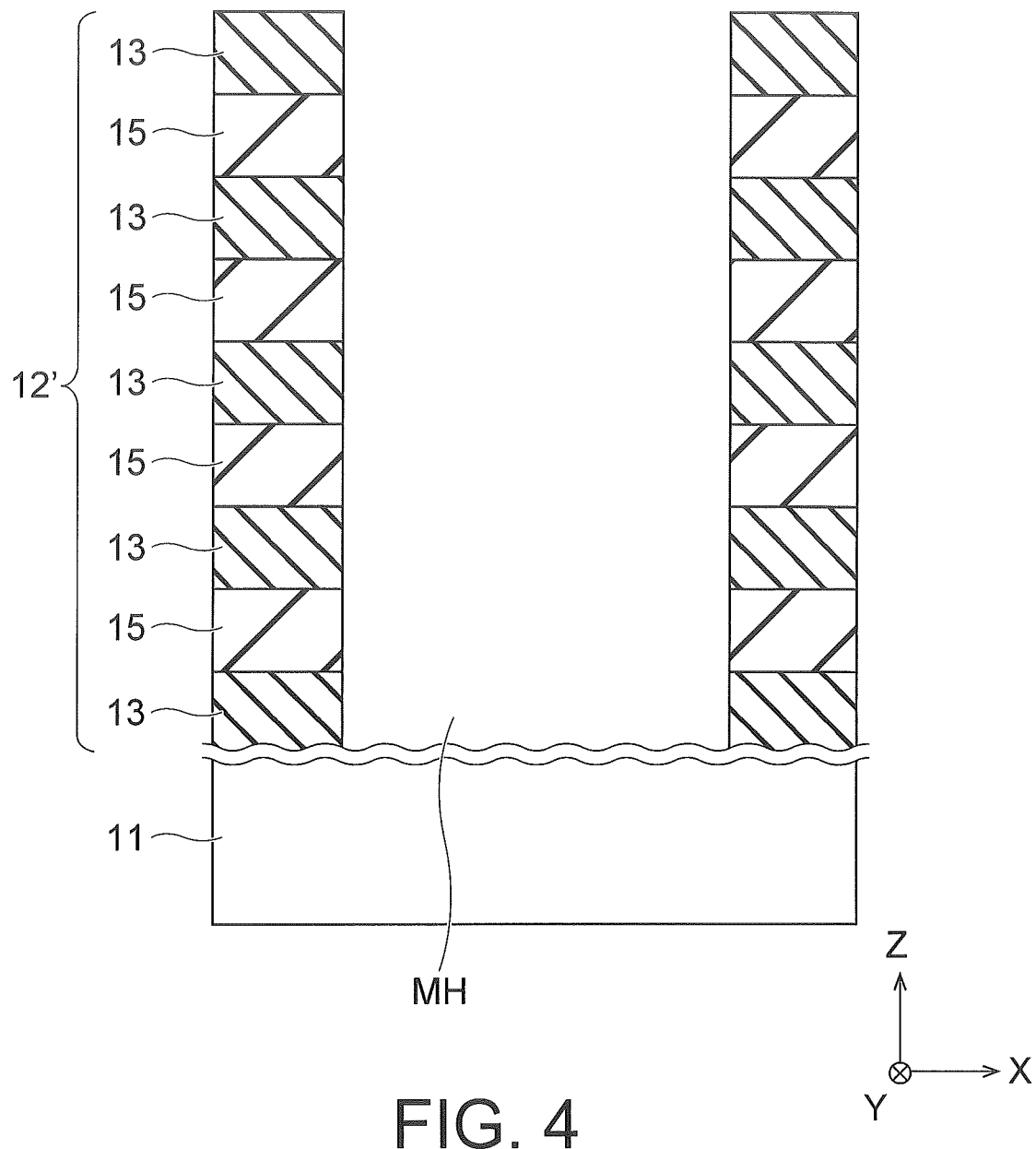

Next, the memory hole MH is formed in the stacked film 12' by lithography and RIE (Reactive Ion Etching) (FIG. 4). The memory hole MH is an example of an opening.

Figure 5:
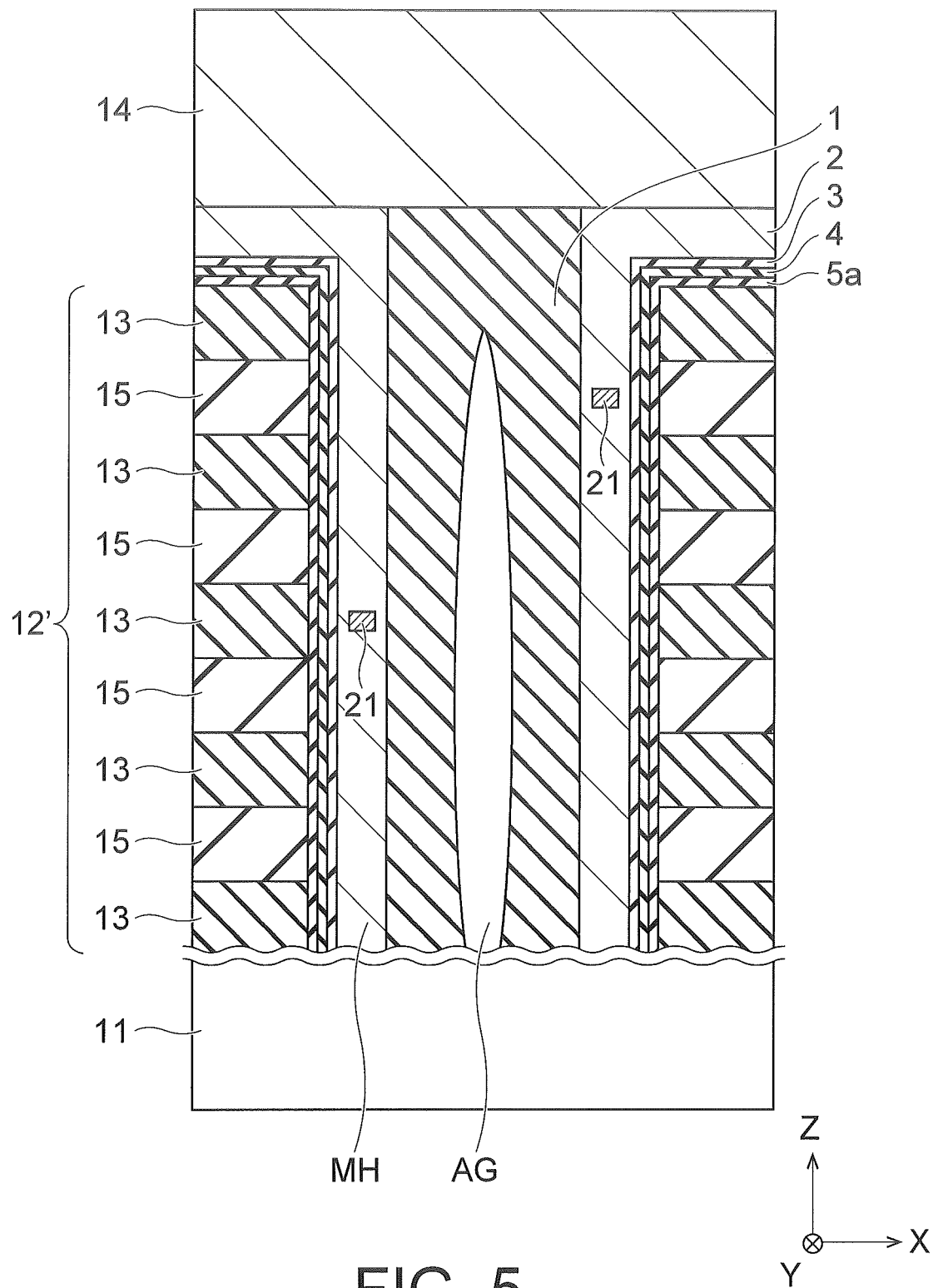

Next, the insulator 5a, the charge storing layer 4, the tunnel insulator 3 and the channel semiconductor layer 2 are sequentially formed on the whole surface of the substrate 11 (FIG. 5). Consequently, the insulator 5a, the charge storing layer 4, the tunnel insulator 3 and the channel semiconductor layer 2 are sequentially formed on the lateral face of the stacked film 12' in the memory hole MH and the upper face of the stacked film 12' outside the memory hole MH. The channel semiconductor layer 2 of the present embodiment is formed so as to include a plurality of metal atoms 21. FIG. 5 schematically shows the metal atoms 21 included in the channel semiconductor layer 2. An example of each of the metal atoms 21 is an Fe (iron) atom, a Ni (nickel) atom, or a Cu (copper) atom. The channel semiconductor layer 2 is an example of a semiconductor layer.

Next, by forming the core insulator 1 on the whole surface of the substrate 11, the core insulator 1 is formed on the lateral face of the channel semiconductor layer 2 in the memory hole MH and the upper face of the channel semiconductor layer 2 outside the memory hole MH, and after that, the core insulator 1 outside the memory hole MH is removed (FIG. 5). Consequently, the core insulator 1 is buried in the memory hole MH. While in the present embodiment, the core insulator 1 is formed so as to include the air gap AG, it may be formed so as not to include the air gap AG.

Next, a getter layer 14 is formed on the whole surface of the substrate 11 (FIG. 5). As a result, the getter layer 14 is formed on the channel semiconductor layer 2 and the core insulator 1 above the stacked film 12 and the memory hole MH. The getter layer 14 of the present embodiment is formed only on the exterior of the memory hole MH out of the interior of the memory hole MH and the exterior of the memory hole MH. The getter layer 14 is an example of a first layer.

The getter layer 14 includes a plurality of Si atoms and a plurality of N (nitrogen) atoms, for example. In this case, the getter layer 14 desirably includes Si atoms and N atoms such that Si is richer than a silicon nitride film represented by the compositional formula "$Si_3N_4$". The ratio of the number of the N atoms relative to the number of the Si atoms and the N atoms in the getter layer 14 of the present embodiment is 40% or less, for example. When the number of the Si atoms in the getter layer 14 is denoted by "K1" and the number of the N atoms in the getter layer 14 is denoted by "K2", this condition is represented by the inequality, $K2/(K1+K2) \leq 0.4$. An example of the getter layer 14 of the present embodiment is an amorphous Si layer (N-doped aSi layer) including N atoms, and it includes Si atoms and N atoms such that they satisfy this inequality. Moreover, when the getter layer 14 of the present embodiment includes Si atoms and N atoms such that Si is richer than the silicon nitride film represented by the constitutional formula "$Si_3N_4$", $K2/(K1+K2)<4/7$ is completed.

The getter layer 14 is formed, for example, by LPCVD (Low Pressure Chemical Vapor Deposition). In this case, the getter layer 14 is desirably formed, in a chamber in an LPCVD apparatus, by controlling the ratio of the flow rate of a source gas for N atoms and the flow rate of a source gas for Si atoms to be 1:5 or less. This makes it possible to form the getter layer 14 satisfying the aforementioned inequality. An example of the source gas for N atoms is an $NH_3$ (ammonia) gas. An example of the source gas for Si atoms is a $SiH_4$ (monosilane) gas. The getter layer 14 of the present embodiment is used for removing the metal atoms 21 in the channel semiconductor layer 2 by gettering into the getter layer 14.

Figure 6:
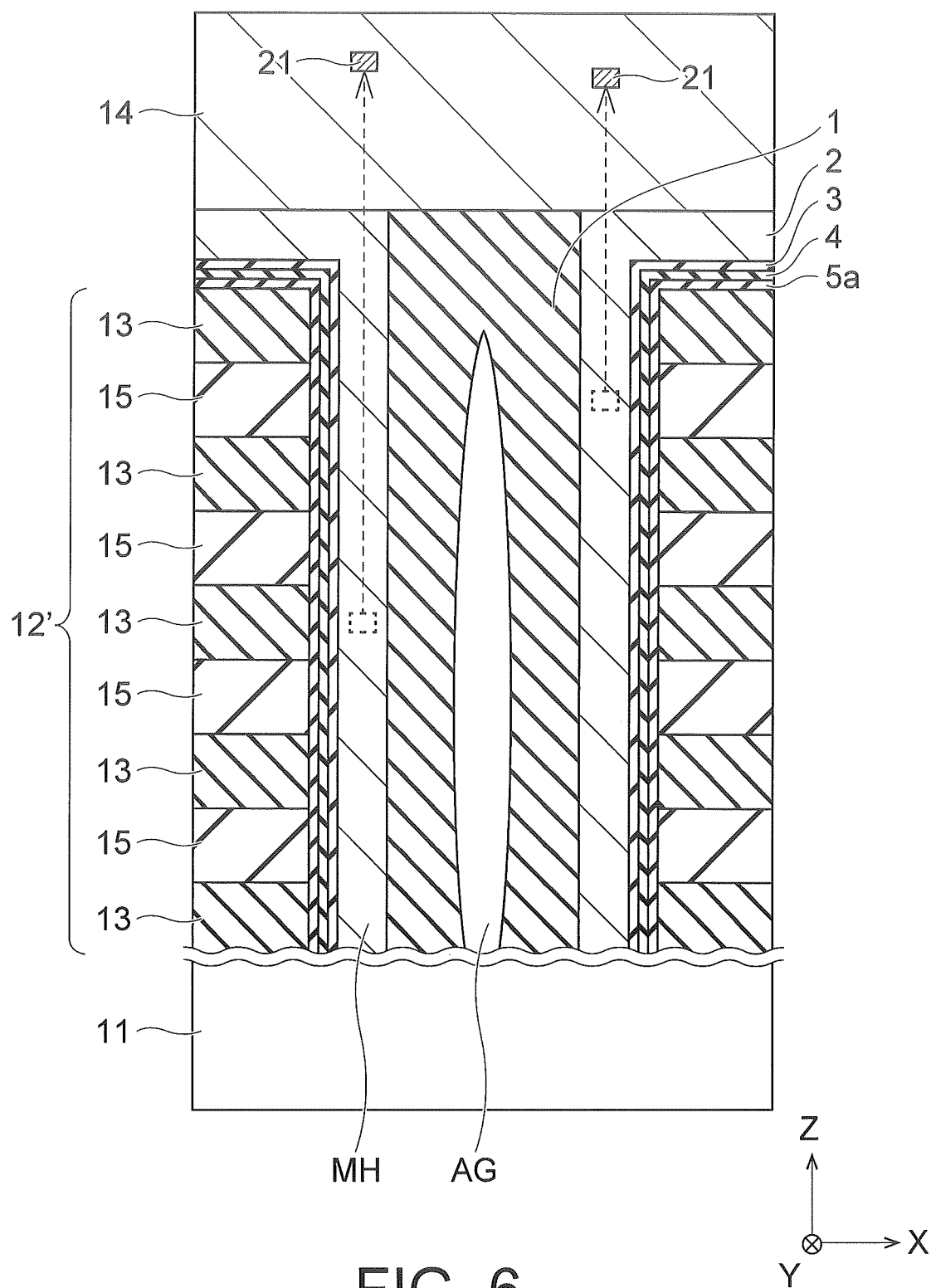

Next, a thermal treatment of heating the channel semiconductor layer 2 and the like is performed (FIG. 6). This makes it possible to transfer at least some of the metal atoms 21 in the channel semiconductor layer 2 into the getter layer 14. Consequently, at least some of the metal atoms 21 in the channel semiconductor layer 2 are removed into the getter layer 14, and the concentration of the metal atoms 21 in the channel semiconductor layer 2 is reduced. This thermal treatment is also called gettering annealing.

The aforementioned thermal treatment is performed, for example, at a temperature of 400° C. or more. This makes it possible to reduce the concentration of the metal atoms 21 in the channel semiconductor layer 2 sufficiently.

The aforementioned thermal treatment may be performed in the chamber same as the chamber in which the channel semiconductor layer 2 is formed. For example, when the channel semiconductor layer 2 is formed by an LPCVD apparatus, both the formation of the channel semiconductor layer 2 and the aforementioned thermal treatment may be performed in the chamber of the LPCVD apparatus. This makes it possible to perform steps from the formation of the channel semiconductor layer 2 to the aforementioned thermal treatment continuously in the chamber without carrying the substrate 11 out of the chamber, and this makes it possible to reduce the number of production steps for semiconductor devices. Since the LPCVD apparatus includes heating means in general, the aforementioned thermal treatment can be performed by this heating means.

The metal atoms 21 may be other than Fe atoms, Ni atoms and Cu atoms. Examples of the metal atoms 21, 22 are Co (cobalt) atoms, Sn (tin) atoms, Pb (lead) atoms, Pd (palladium) atoms, Ru (ruthenium) atoms, Rh (rhodium) atoms, Os (osmium) atoms, Ir (iridium) atoms, Pt (platinum) atoms, Au (gold) atoms, Al (aluminum) atoms, Ag (silver) atoms and the like.

Figure 7:
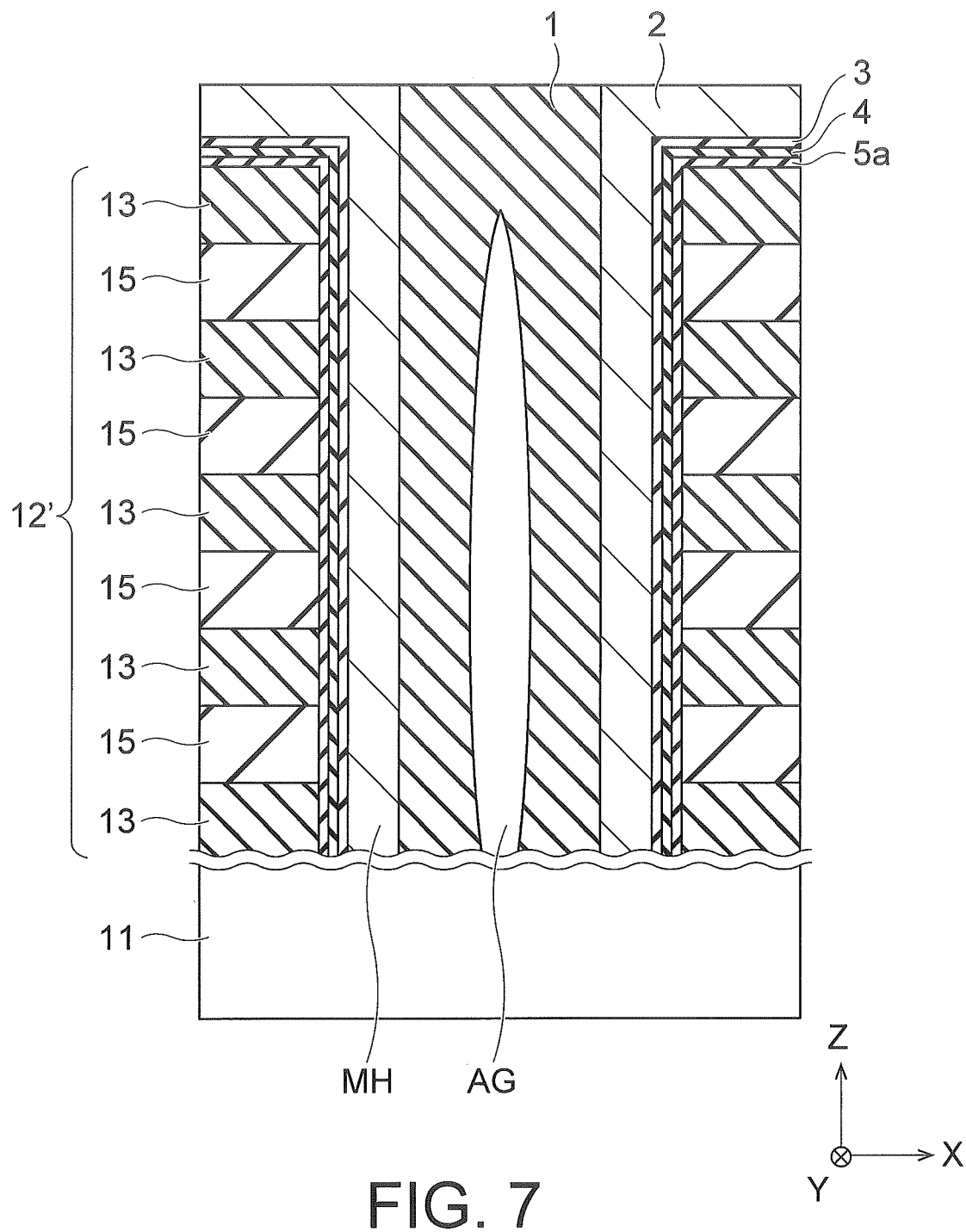

Next, the getter layer 14 is removed (FIG. 7). The getter layer 14 may be removed by wet etching using a liquid chemical (aqueous hot phosphoric acid solution, for example) or may be removed by dry etching using gas (chlorine, for example). In the present embodiment, by removing the getter layer 14, the metal atoms 21 having been transferred into the getter layer 14 are also to be removed.

The step shown in FIG. 7 (removing step) may be performed in the chamber same as a chamber in which the channel semiconductor layer 2 is removed. For example, when the channel semiconductor layer 2 is formed by the LPCVD apparatus, the formation of the channel semiconductor layer 2, the aforementioned thermal treatment, and the aforementioned removing processing may be performed in the chamber of the LPCVD apparatus. This makes it possible to perform steps from the formation of the channel semiconductor layer 2 to the aforementioned removing processing continuously in the chamber without carrying the substrate 11 out of the chamber, and this makes it possible to reduce the number of production steps for semiconductor devices. For example, this makes it possible to perform the aforementioned removing processing by the LPCVD apparatus, by changing gas fed into the chamber from gas for CVD to gas for etching.

Figure 8:
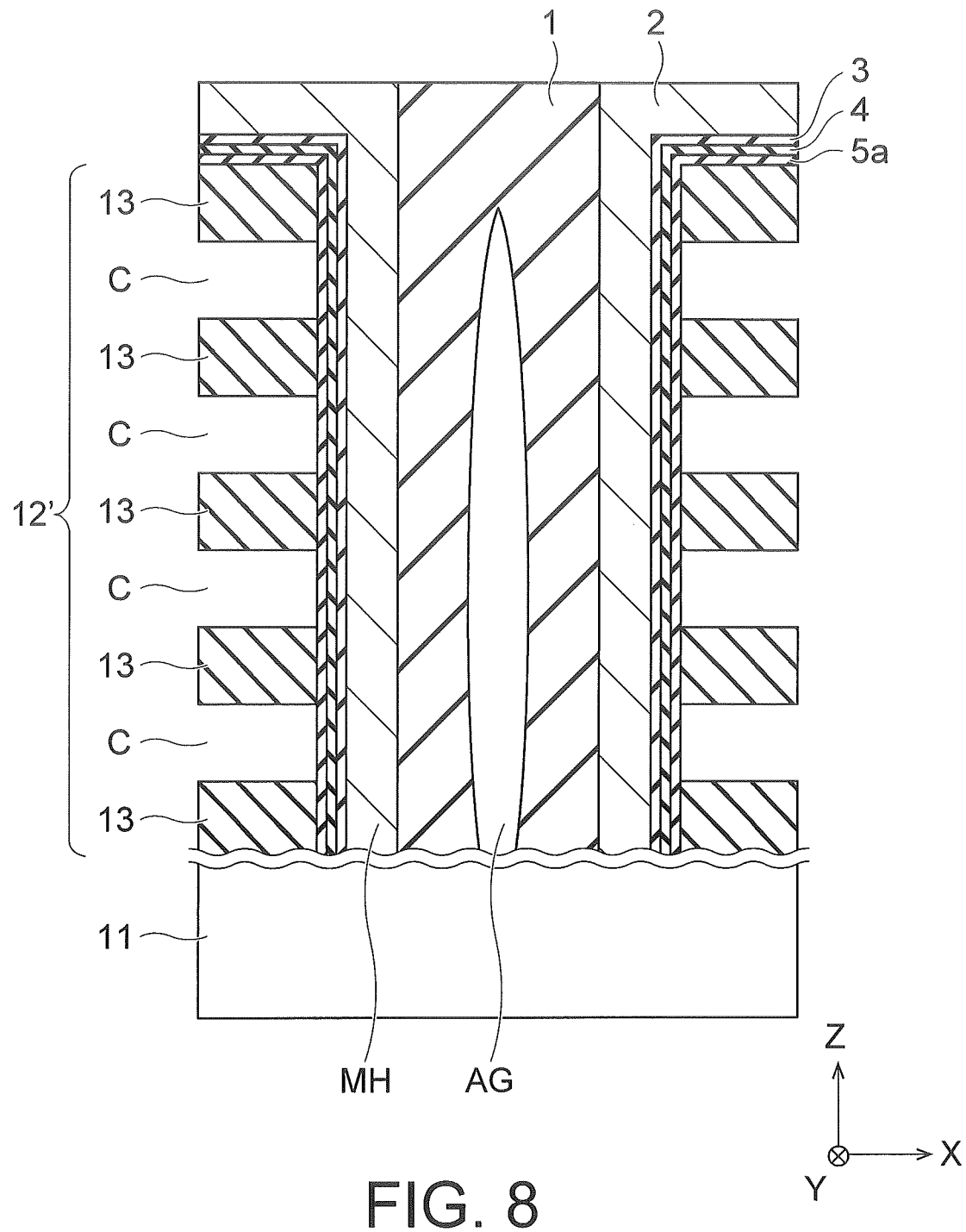

Next, a slit (not shown) is formed in the stacked film 12' by lithography and RIE, and the sacrificial layers 15 are removed by wet etching from the slit (FIG. 8). Consequently, a plurality of hollows C are formed between the insulating layers 13 in the stacked film 12'.

After that, the insulators 5b, the barrier metal layers 6a and the electrode material layers 6b are sequentially formed in these hollows C. Consequently, the plurality of electrode layers 6 are formed in these hollows C, and the stacked film 12 is formed on the substrate 11 (see FIG. 2). As above, the sacrificial layers 15 are replaced by the electrode layers 6, and the semiconductor device of the present embodiment is manufactured.

Hereafter, continuously referring to FIGS. 3 to 8, the method of manufacturing a semiconductor device of the present embodiment is described further in detail.

It is now assumed that the getter layer 14 includes a plurality of Si atoms, and a plurality of B (boron) atoms, a plurality of P (phosphorus) atoms or a plurality of As (arsenic) atoms. An example of such a getter layer 14 is an amorphous Si layer (P-doped aSi layer) including P atoms. In this case, an etching selectivity ratio between the getter layer 14 and its lower layer is small, which can cause a concern that the getter layer 14 is not able to be removed in the aforementioned removing step.

On the contrary, the getter layer 14 of the present embodiment includes a plurality of Si atoms, and a plurality of N atoms, for example. An example of such a getter layer 14 is an amorphous Si layer (N-doped aSi layer) including N atoms. This makes it possible to make the etching selectivity ratio between the getter layer 14 and its lower layer large, and this makes it possible to remove the getter layer 14 in the aforementioned removing step.

Moreover, experiments reveal that gettering with an N-doped aSi layer can remove more metal atoms 21 from the channel semiconductor layer 2 into the getter layer 14 than gettering with a P-doped aSi layer. Therefore, the present embodiment makes it possible to improve gettering performance of the getter layer 14 by using an N-doped aSi layer as the getter layer 14. The reason can be considered, for example, as a tendency that N atoms more readily enter the silicon lattice than P atoms, a tendency that the N concentration can be more readily made high than the P concentration, and/or the like, since N atoms are smaller than P atoms.

Moreover, the ratio of the number of the N atoms relative to the number of the Si atoms and the N atoms in the getter layer 14 of the present embodiment is 40% or less, for example, and the aforementioned thermal treatment of the present embodiment is performed, for example, at a temperature of 400° C. or more. This makes it possible to reduce the concentration of the metal atoms 21 in the channel semiconductor layer 2 sufficiently while realizing the preferable getter layer 14.

Figure 9:
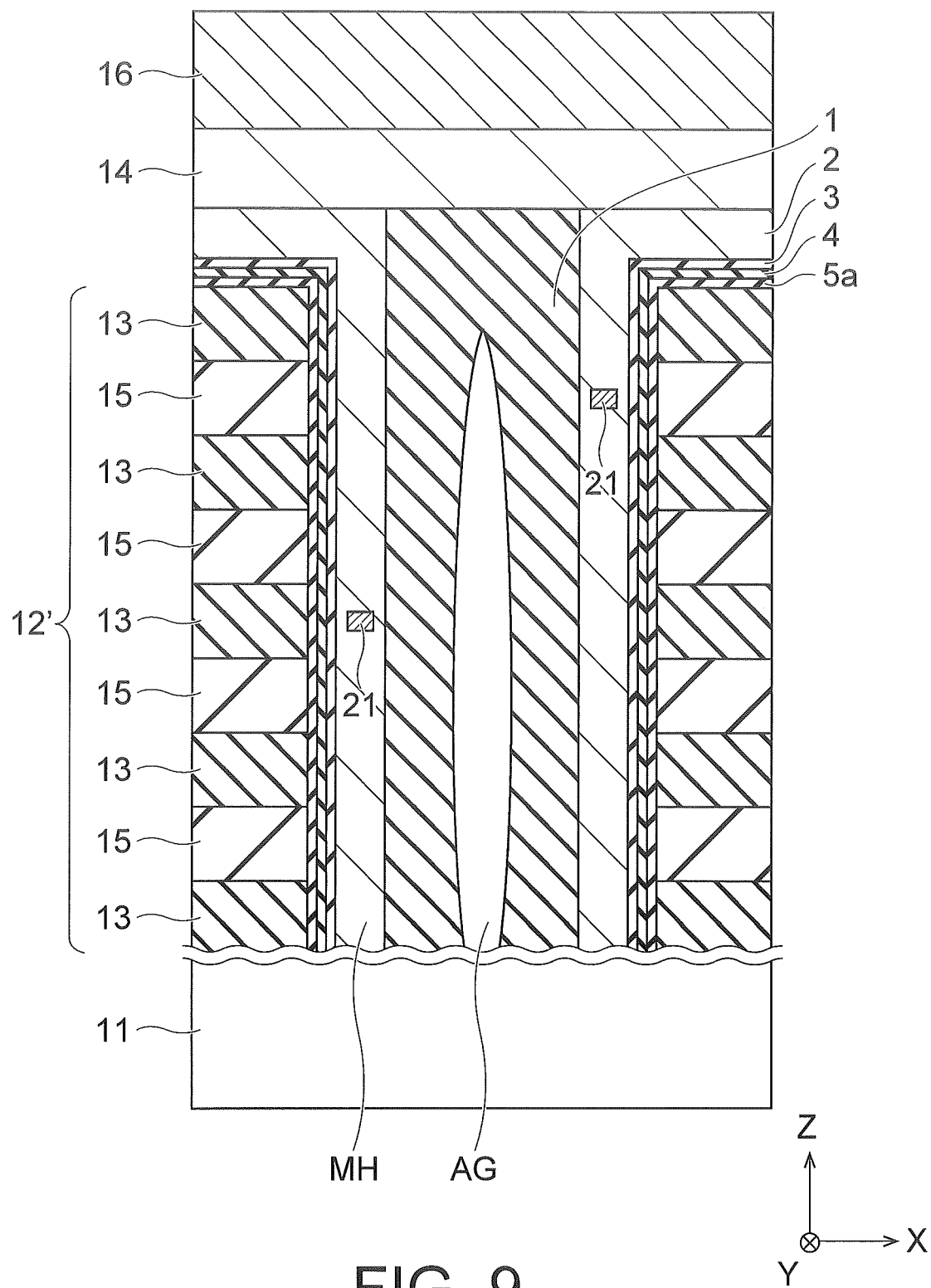
FIGS. 9 and 10 are sectional views showing a method of manufacturing a semiconductor device of a modification of the first embodiment.
Figure 10:
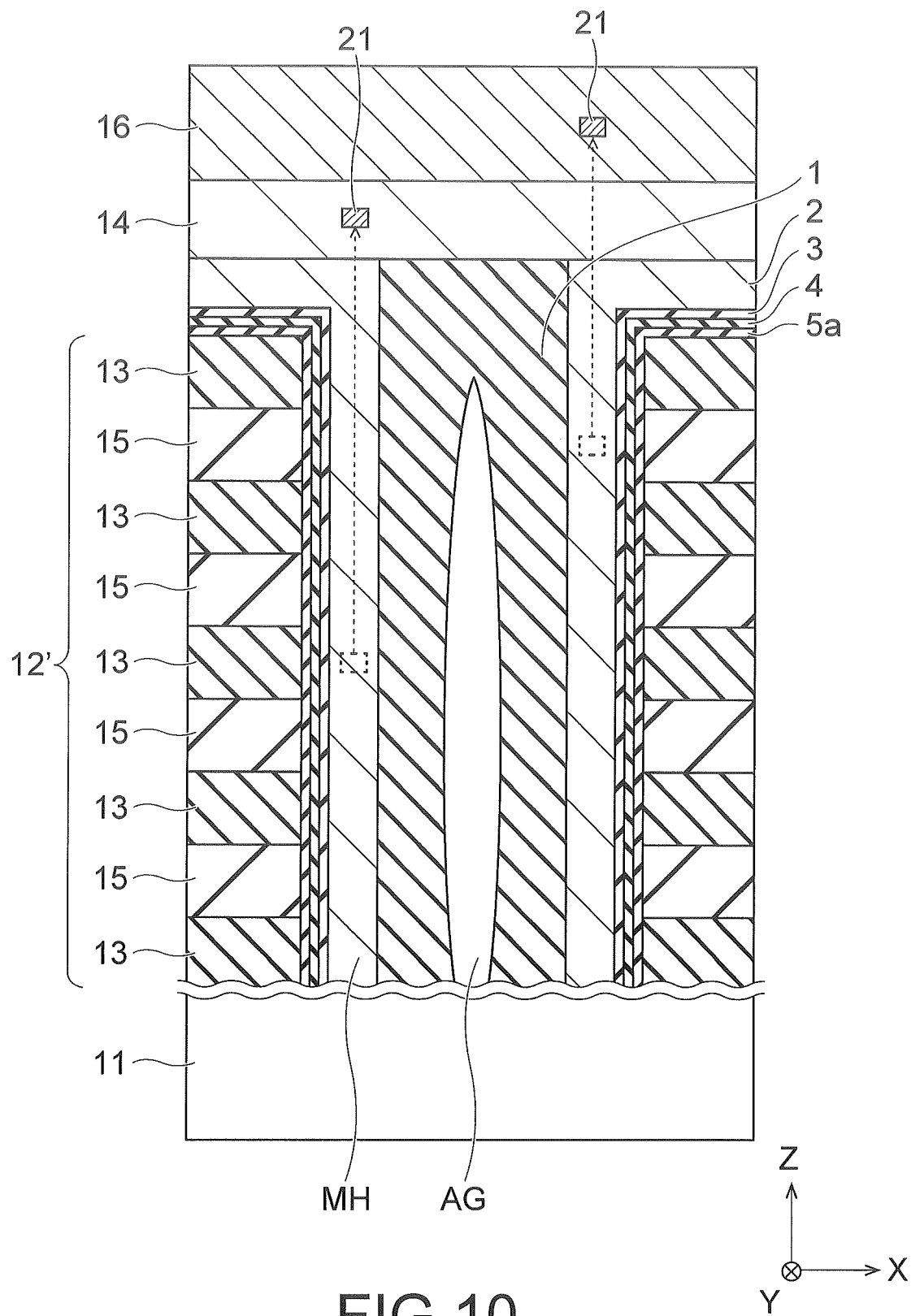

FIGS. 9 and 10 are sectional views showing a method of manufacturing a semiconductor device of a modification of the first embodiment.

First, the steps shown in FIGS. 3 to 5 are performed. Note that in the step shown in FIG. 5, a getter layer 16 is formed on the getter layer 14 (FIG. 9). As a result, the structure shown in FIG. 9 is realized. The getter layer 16 includes a plurality of Si atoms, and includes a plurality of B (boron) atoms, a plurality of P (phosphorus) atoms or As (arsenic) atoms, for example. Examples of such a getter layer 16 are an amorphous Si layer including B atoms (B-doped aSi layer), an amorphous Si layer including P atoms (P-doped aSi layer), and an amorphous Si layer including As atoms (As-doped aSi layer). The getter layer 16 is an example of a second layer.

Next, a thermal treatment of heating the channel semiconductor layer 2 and the like is performed (FIG. 10). This makes it possible to transfer at least some of the metal atoms 21 in the channel semiconductor layer 2 into the getter layer 14 and the getter layer 16. Consequently, at least some of the metal atoms 21 in the channel semiconductor layer 2 are removed into the getter layers 14 and 16, and the concentration of the metal atoms 21 in the channel semiconductor layer 2 is reduced. The thermal treatment in FIG. 10 can be performed similarly to the thermal treatment in FIG. 6.

Next, the steps shown in FIGS. 7 and 8 are performed. Note that in the step shown in FIG. 7, the getter layer 16, in addition to the getter layer 14, is removed. In the present modification, by removing the getter layers 14 and 16, the metal atoms 21 having been transferred into the getter layers 14 and 16 are also to be removed. Since the getter layer 16 is formed on the getter layer 14, it can be readily removed by the step shown in FIG. 7. As above, the semiconductor device of the present modification is manufactured. The structure of the semiconductor device of the present modification is the same as the structure of the semiconductor device of the first embodiment.

As above, in the present embodiment, the metal atoms 21 in the channel semiconductor layer 2 are removed using the getter layer 14 (N-doped aSi layer, for example) including N atoms. The present embodiment therefore makes it possible to remove the metal atoms 21 in the channel semiconductor layer 2 using the preferable getter layer 14. For example, this makes it possible to remove the getter layer 14 readily and to improve gettering performance of the getter layer 14.

Second Embodiment

FIGS. 11 to 14 are sectional views showing a method of manufacturing a semiconductor device of a second embodiment.

Figure 11:
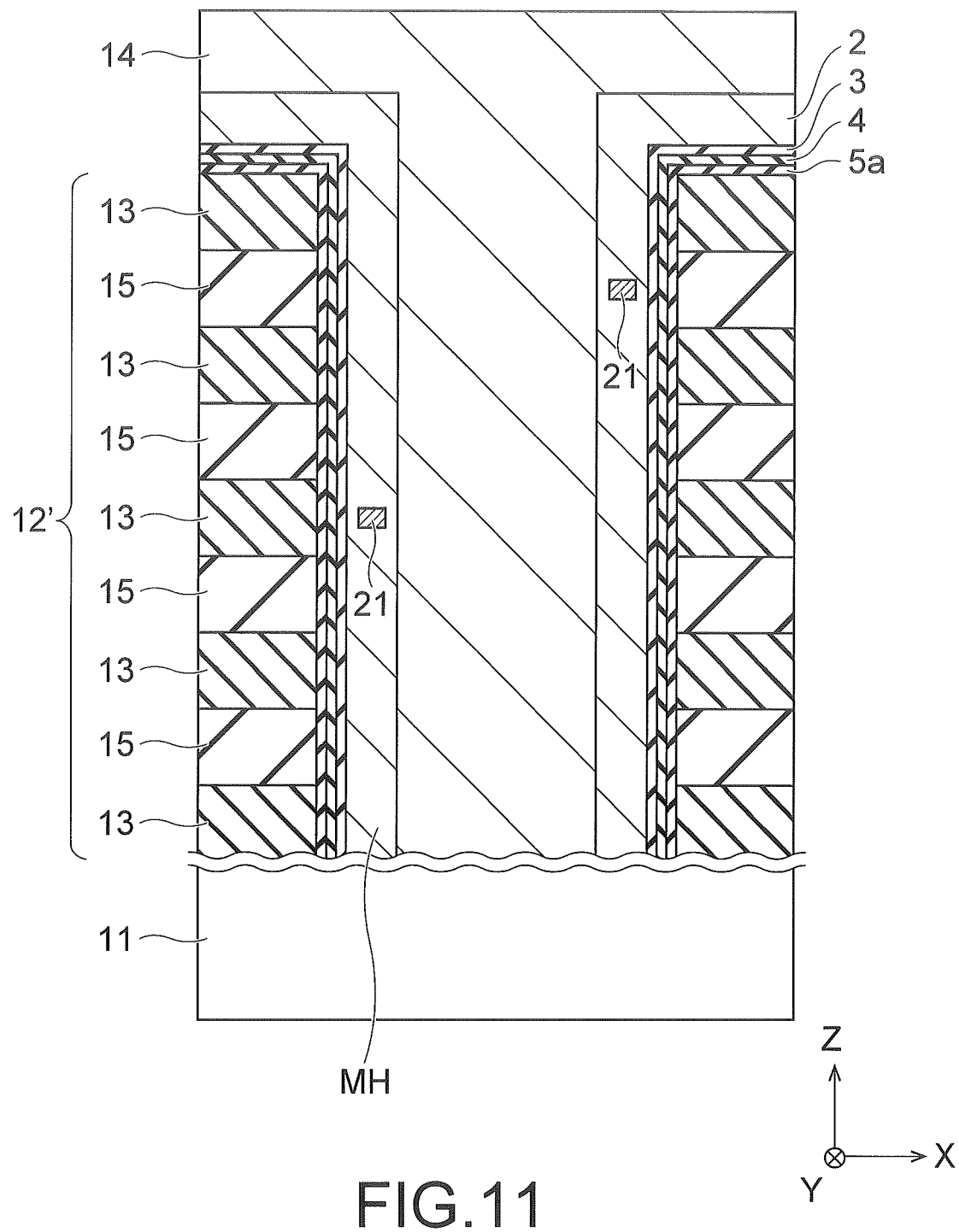
FIGS. 11 to 14 are sectional views showing a method of manufacturing a semiconductor device of a second embodiment.

First, the steps shown in FIGS. 3 to 5 are performed. Note that in the step shown in FIG. 5, the core insulator 1 is not formed (FIG. 11). As a result, the structure shown in FIG. 11 is realized. The getter layer 14 of the present embodiment is formed on the lateral face of the channel semiconductor layer 2 in the memory hole MH and the upper face of the channel semiconductor layer 2 outside the memory hole MH.

Figure 12:
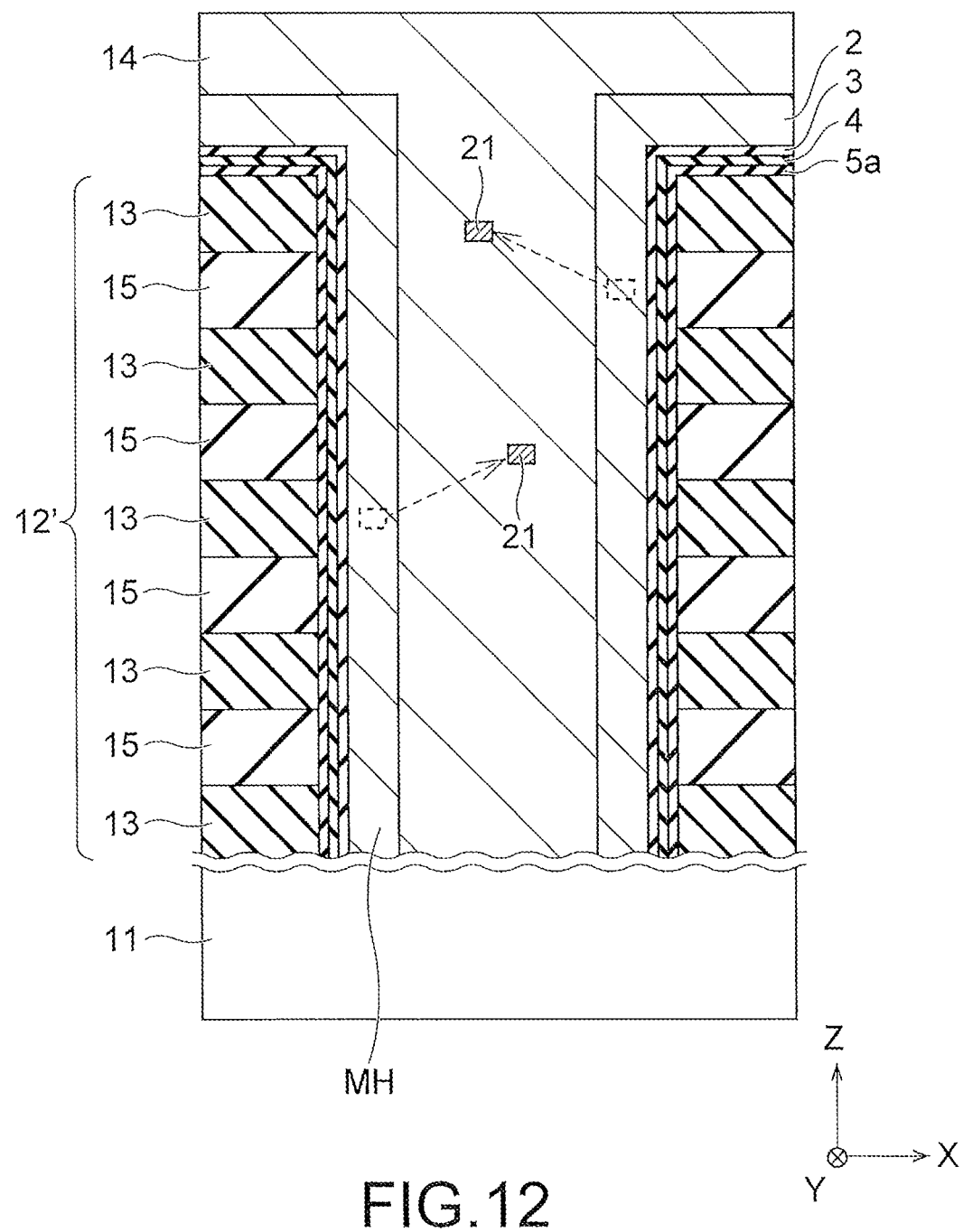

Next, a thermal treatment of heating the channel semiconductor layer 2 and the like is performed (FIG. 12). This makes it possible to transfer at least some of the metal atoms 21 in the channel semiconductor layer 2 into the getter layer 14. Consequently, at least some of the metal atoms 21 in the channel semiconductor layer 2 are removed into the getter layer 14, and the concentration of the metal atoms 21 in the channel semiconductor layer 2 is reduced. The metal atoms 21 in the channel semiconductor layer 2 may be removed into the getter layer 14 in the memory hole MH and may be removed into the getter layer 14 outside the memory hole MH. The thermal treatment in FIG. 12 can be performed similarly to the thermal treatment in FIG. 6.

Figure 13:
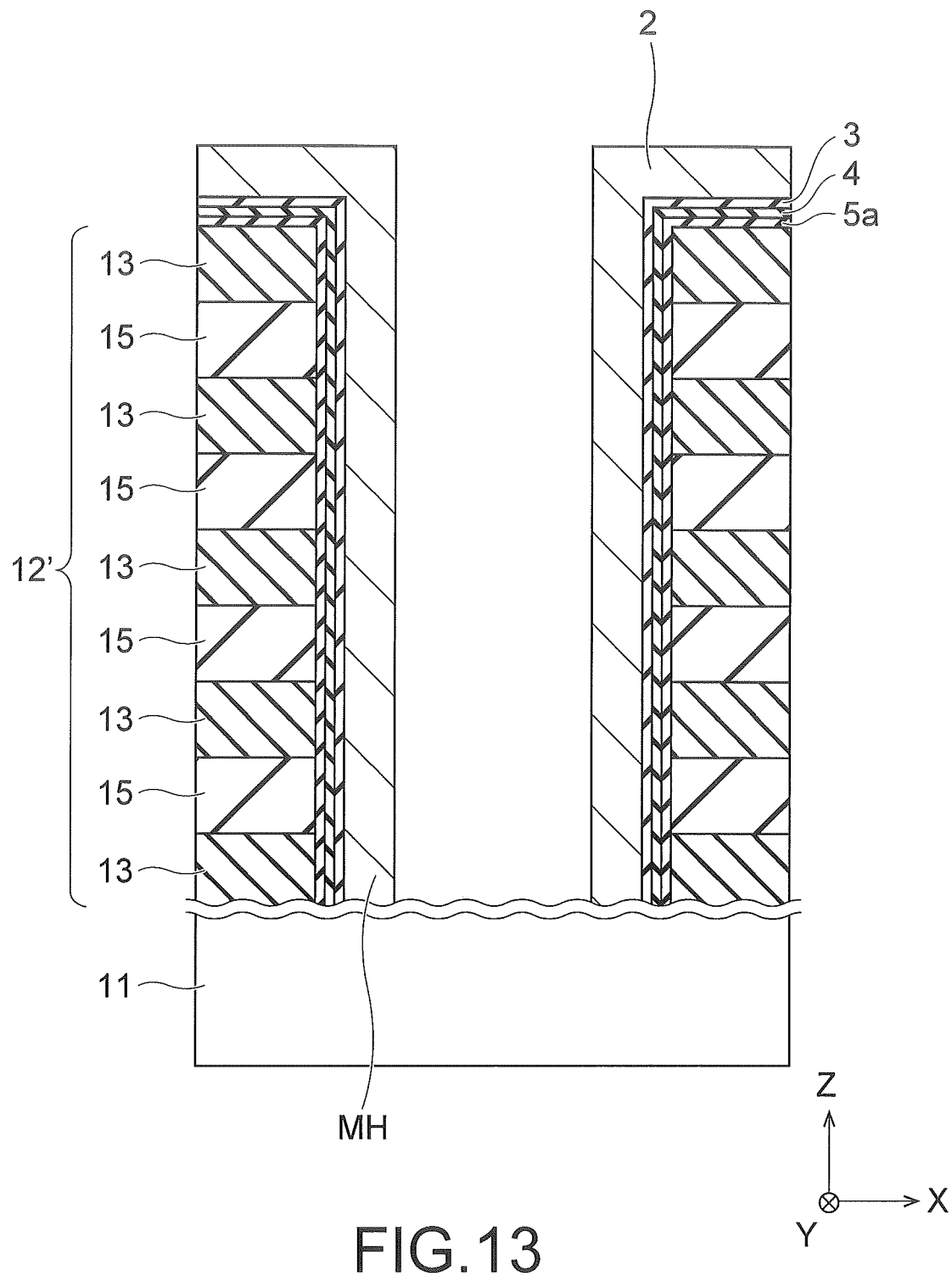

Next, the getter layer 14 is removed (FIG. 13). In the present embodiment, by removing the getter layer 14, the metal atoms 21 having been transferred into the getter layer 14 are also to be removed. The removing processing in FIG. 13 can be performed similarly to the removing processing in FIG. 7.

Figure 14:
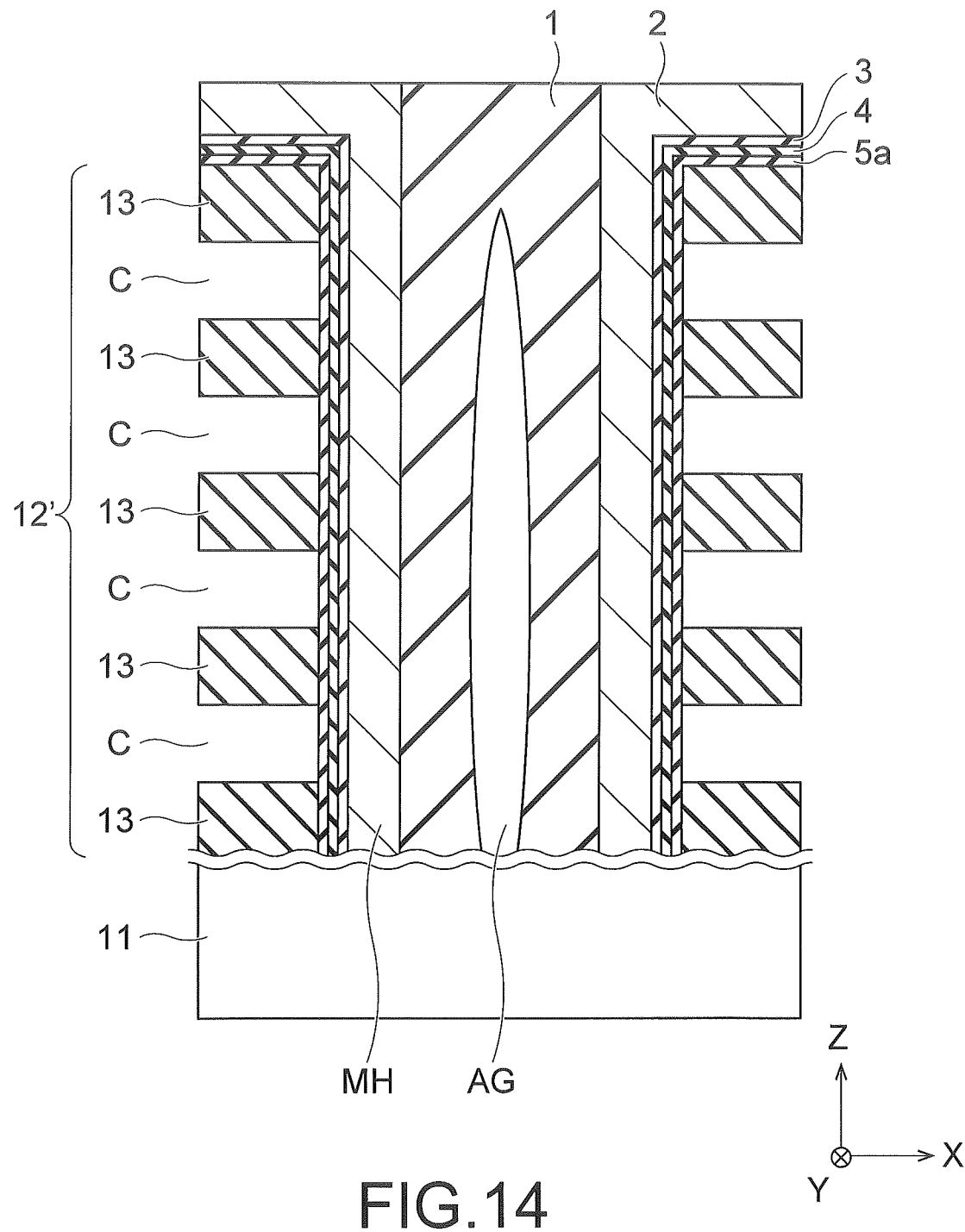

Next, by forming the core insulator 1 on the whole surface of the substrate 11, the core insulator 1 is formed on the lateral face of the channel semiconductor layer 2 in the memory hole MH and the upper face of the channel semiconductor layer 2 outside the memory hole MH, and after that, the core insulator 1 outside the memory hole MH is removed (FIG. 14). Consequently, the core insulator 1 is buried in the memory hole MH. While in the present embodiment, the core insulator 1 is formed so as to include the air gap AG, it may be formed so as not to include the air gap AG.

Next, a slit (not shown) is formed in the stacked film 12' by lithography and RIE, and the sacrificial layers 15 are removed by wet etching from the slit (FIG. 14). Consequently, the plurality of hollows C are formed between the insulating layers 13 in the stacked film 12'.

After that, the insulators 5b, the barrier metal layers 6a and the electrode material layers 6b are sequentially formed in these hollows C. Consequently, the plurality of electrode layers 6 are formed in these hollows C, and the stacked film 12 is formed on the substrate 11 (see FIG. 2). As above, the sacrificial layers 15 are replaced by the electrode layers 6, and the semiconductor device of the present embodiment is manufactured. The structure of the semiconductor device of the present embodiment is the same as the structure of the semiconductor device of the first embodiment.

Hereafter, continuously referring to FIGS. 11 to 14, the method of manufacturing a semiconductor device of the present embodiment is described further in detail.

The getter layer 14 of the present embodiment is also formed in the memory hole MH as well as outside the memory hole MH. Therefore, it is considered that the getter layer 14 of the present embodiment is seemingly more scarcely removed than the getter layer 14 of the first embodiment. Nevertheless, the present embodiment makes it possible to make its removal readily by employing the getter layer 14 (N-doped aSi layer, for example) including N atoms.

As above, in the present embodiment, the metal atoms 21 in the channel semiconductor layer 2 are removed using the getter layer 14 (N-doped aSi layer, for example) including N atoms. Therefore, the present embodiment makes it possible to remove the metal atoms 21 in the channel semiconductor layer 2 using the preferable getter layer 14 similarly to the first embodiment. For example, this makes it possible to remove the getter layer 14 readily and to improve gettering performance of the getter layer 14.

The semiconductor devices of the first and second embodiments may be a three-dimensional semiconductor memory of different type from that of the aforementioned three-dimensional semiconductor memory or may be a semiconductor memory other than a three-dimensional semiconductor memory. Furthermore, the semiconductor devices of the first and second embodiments may be a semiconductor device other than a semiconductor memory.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
    forming a semiconductor layer including a plurality of metal atoms on a substrate;
    forming a first layer including a plurality of silicon atoms and a plurality of nitrogen atoms on the semiconductor layer;
    transferring at least some of the metal atoms in the semiconductor layer into the first layer; and
    removing the first layer after transferring the at least some of the metal atoms in the semiconductor layer into the first layer,
    wherein a ratio of a number of the nitrogen atoms relative to a number of the silicon atoms and the nitrogen atoms in the first layer is smaller than 4/7.

2. The method of claim 1, wherein the metal atoms are Fe (iron) atoms, Ni (nickel) atoms, Cu (copper) atoms, Co (cobalt) atoms, Sn (tin) atoms, Pb (lead) atoms, Pd (palladium) atoms, Ru (ruthenium) atoms, Rh (rhodium) atoms, Os (osmium) atoms, Ir (iridium) atoms, Pt (platinum) atoms, Au (gold) atoms, Al (aluminum) atoms or Ag (silver) atoms.

3. The method of claim 1, wherein the first layer is a silicon layer including a plurality of nitrogen atoms.

4. The method of claim 3, wherein the silicon layer is an amorphous silicon layer.

5. The method of claim 1, wherein the ratio of the number of the nitrogen atoms relative to the number of the silicon atoms and the nitrogen atoms in the first layer is 40% or less.

6. The method of claim 1, wherein the first layer is formed by controlling a ratio of a flow rate of a source gas for the nitrogen atoms and a flow rate of a source gas for the silicon atoms to be 1:5 or less.

7. The method of claim 1, further comprising:
alternately forming a plurality of first films and a plurality of second films on the substrate;
forming an opening in the first and second films; and
forming a charge storing layer in the opening,
wherein the semiconductor layer is formed in the opening via the charge storing layer.

8. The method of claim 7, wherein the first layer is formed outside the opening and is not formed inside the opening.

9. The method of claim 7, wherein the first layer is formed at least in the opening.

10. The method of claim 1, wherein the at least some of the metal atoms in the semiconductor layer are transferred into the first layer by a thermal treatment of the semiconductor layer.

11. The method of claim 10, wherein the thermal treatment is performed at a temperature of 400° C. or more.

12. The method of claim 10, wherein the thermal treatment is performed in a chamber same as a chamber in which the semiconductor layer is formed.

13. The method of claim 1, wherein the first layer is removed using a liquid chemical or gas.

14. The method of claim 1, wherein the first layer is removed in a chamber same as a chamber in which the semiconductor layer is formed.

15. The method of claim 1, further comprising:
forming a second layer that is a silicon layer including a plurality of boron atoms, a plurality of phosphorus atoms or a plurality of arsenic atoms, on the first layer;
transferring the at least some of the metal atoms in the semiconductor layer into the first and second layers; and
removing both the first and second layers after transferring the at least some of the metal atoms in the semiconductor layer into both the first and second layers.

16. A method of manufacturing a semiconductor device, comprising:
forming a semiconductor layer including a plurality of metal atoms on a substrate;
forming a first layer including a plurality of nitrogen atoms on the semiconductor layer;
transferring at least some of the metal atoms in the semiconductor layer into the first layer; and
removing the first layer after transferring the at least some of the metal atoms in the semiconductor layer into the first layer,
wherein the at least some of the metal atoms in the semiconductor layer are transferred into the first layer by a thermal treatment of the semiconductor layer, the thermal treatment being performed in a chamber same as a chamber in which the semiconductor layer is formed, or
wherein the first layer is removed in a chamber same as the chamber in which the semiconductor layer is formed.

17. The method of claim 16, wherein the first layer includes a plurality of silicon atoms and the plurality of nitrogen atoms.

18. The method of claim 17, wherein a ratio of a number of the nitrogen atoms relative to a number of the silicon atoms and the nitrogen atoms in the first layer is smaller than 4/7.

19. The method of claim 17, wherein a ratio of a number of the nitrogen atoms relative to a number of the silicon atoms and the nitrogen atoms in the first layer is 40% or less.

20. The method of claim 16, wherein the first layer is a silicon layer including the plurality of nitrogen atoms.

* * * * *